United States Patent [19]
Nakadai et al.

[11] Patent Number: 5,909,117
[45] Date of Patent: Jun. 1, 1999

[54] APPARATUS AND METHOD FOR INSPECTING DISKS

[75] Inventors: Tsutomu Nakadai, Yokohama; Osamu Ishiwata, Odawara, both of Japan

[73] Assignee: Hitachi Electronics Engineering Co., Ltd., Tokyo, Japan

[21] Appl. No.: 08/925,425

[22] Filed: Sep. 8, 1997

[30] Foreign Application Priority Data

Sep. 10, 1996 [JP] Japan .................................. 8-261294

[51] Int. Cl.⁶ .................................................. G01R 33/12
[52] U.S. Cl. ............................ 324/212; 360/31; 369/58
[58] Field of Search .................................. 324/210, 211, 324/212, 213, 260, 262; 360/53, 31, 113; 369/58

[56] References Cited

U.S. PATENT DOCUMENTS 5,245,403  9/1993  Kato et al. ............................ 356/237
5,423,111  6/1995  Mori ..................................... 29/90.01
5,640,089  6/1997  Horikawa et al. ..................... 324/212

FOREIGN PATENT DOCUMENTS 4-301714  10/1992  Japan .
7-190951   7/1995  Japan .

*Primary Examiner*—Jay M. Patidar
*Attorney, Agent, or Firm*—Fay, Sharpe, Beall, Fagan, Minnich & McKee

[57] ABSTRACT

Functional devices for inspecting disks are arranged around a turntable at equal spacings of angle $2n\pi/(n+m)$ in the order of the operations they perform. The turntable is rotated both in forward direction by angle $2n\pi/(n+m)$ and in reverse direction by angle $2m\pi/(n+m)$ such that the total angle of rotations in forward direction is equal to that of rotations in reverse direction when the necessary operations have completed without causing the turntable to rotate fully once.

14 Claims, 7 Drawing Sheets

PRIOR ART

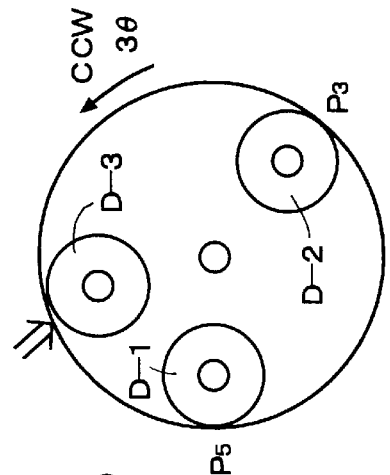
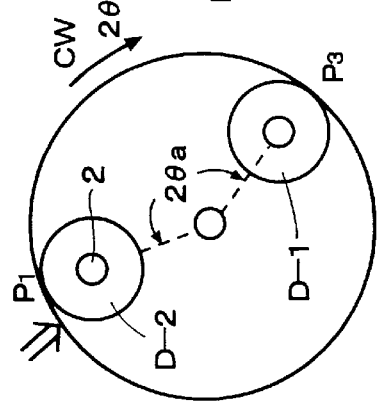
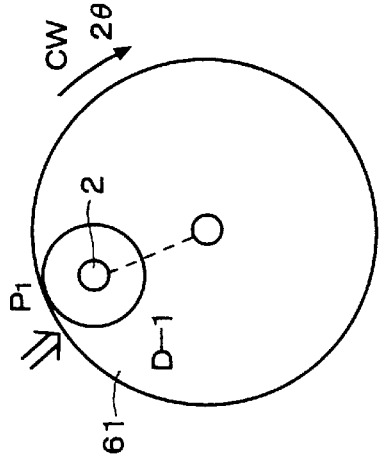
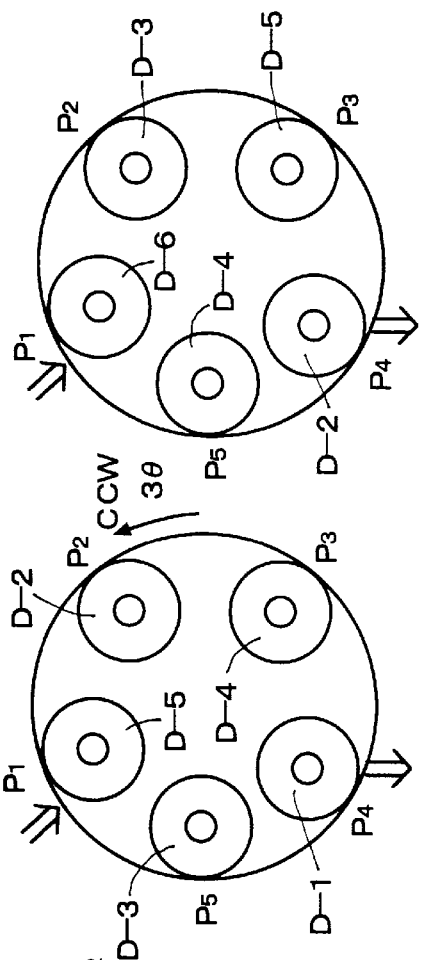

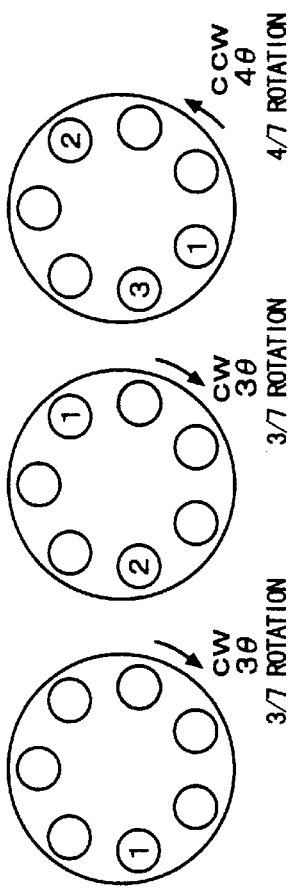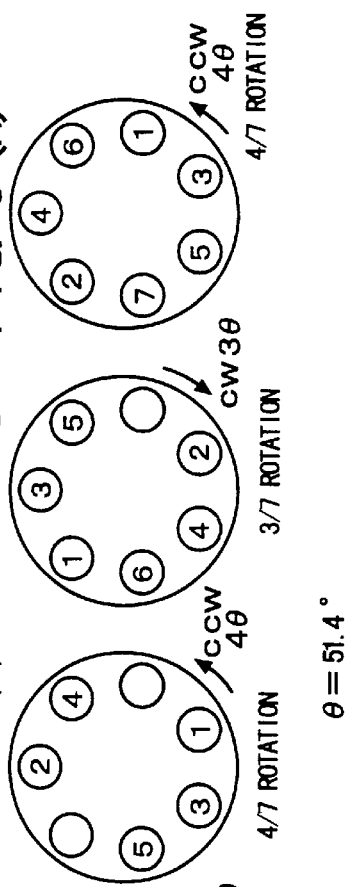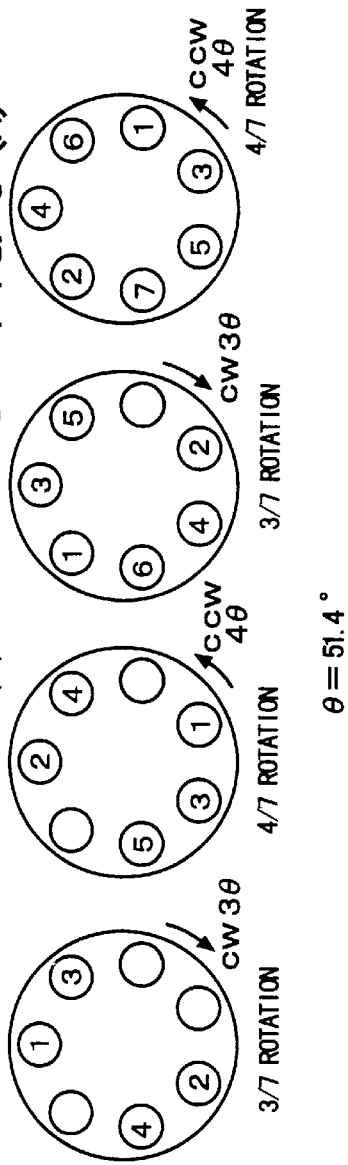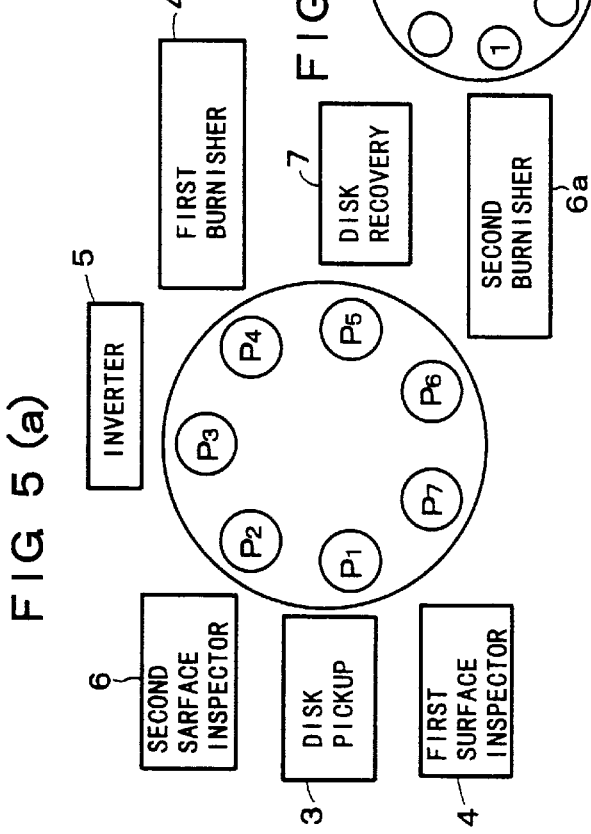

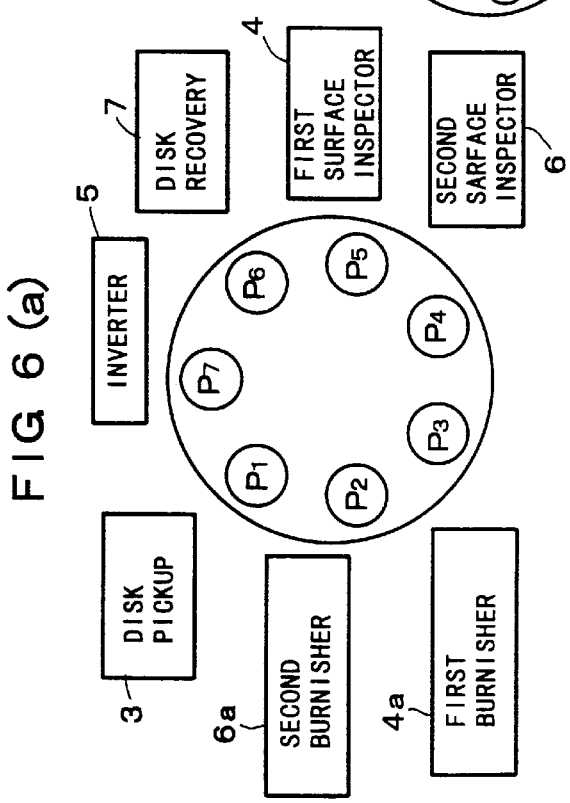

$\theta = 45°$

APPARATUS AND METHOD FOR INSPECTING DISKS

BACKGROUND OF THE INVENTION

This invention relates to an apparatus and a method for inspecting disks. More particularly, the invention relates to an apparatus with which both surfaces of magnetic disks or substrate disks of magnetic disks arranged sequentially on a rotating turntable can be inspected continuously without causing the turntable to rotate fully once.

Magnetic disks for use in information recording, its substrate disks and other disks (which are hereinafter sometimes referred to simply as "disks") are tested with a disk inspector to check to see if they have any surface defects or if they exhibit sufficiently good electrical performance to work as recording media. In the test, a plurality of disks to be inspected are packed in a cassette; from which they are sequentially taken out and mounted on spindles on the inspector; after one surface of the disk is inspected, it is inverted and the other surface is inspected; after both surfaces have been inspected, the respective disks are placed into different cassettes or into a single cassette in different positions according to the result of inspection.

FIG. 8 shows a conventional disk inspector of a type that is capable of efficient inspection of both surfaces of disks as they are arranged on a rotating turntable and which is described in Unexamined Japanese Patent Application No. Hei 4-301714. As shown, the turntable generally indicated by 1 has a plurality of spindles 2 arranged at equal angular spacings. In the positions around the turntable 1 which correspond to the respective spindles 2, a disk pickup 3, a first surface inspector 3, an inverter 5, a second surface inspector 6 and a disk recovery 7 are sequentially arranged counterclockwise in the order of I to V.

Disks D (workpieces) are sequentially mounted on the individual spindles 2 by means of the pickup 3 as the turntable rotates through a specified angle. When the turntable 1 rotates through another specified angle, the disks D are transferred to the subsequent functional devices and, after inspection of one surface, inversion and inspection of the other surface that are performed in response to incremental rotations of the turntable 1, the disks D are ejected sequentially by means of the recovery 7.

Shown by 2a is a disk chuck provided on each spindle 2 for chucking the disk.

Using a turntable, the disk inspector described above is capable of inspecting disks continuously. However, in order to drive the individual spindles arranged on the turntable, wire connections are necessary not only for power supply to each spindle but also for control signals. This need cannot be met by direct wiring to the spindles since the turntable used in the prior art apparatus makes more than one rotation to perform the necessary inspecting operations. To deal with this difficulty, the turntable has to be connected to each spindle by means of contacts provided between the turntable and each of the terminals for power supply and control signals However, if this approach is applied to the turntable equipped with many spindles, the number of contacts increases and poor contact is most likely to occur due to rotational contacts. In addition, the apparatus has high possibility of failure.

One may think of dealing with the situation by rotating the turntable fully once and then rotating it in reverse direction to the start position. However, even in this way, the wires will warp around the lower part of the apparatus, potentially causing a failure of the apparatus and breakage of the wires.

SUMMARY OF THE INVENTION

The present invention has been accomplished under these circumstances and has as an object providing an apparatus for inspecting disks continuously without rotating the turntable fully once.

Another object of the invention is to provide a method for inspecting disks continuously without rotating the turntable fully once.

The first object of the invention can be attained by a disk inspector comprising:

a turntable;

spindles;

at least five functional devices which are sequentially assigned in correspondence with the spindles as they are provided around the turntable at equal spacings of an angle of $2n\pi/(n+m)$ in a given direction and in the order of functional operations which are to be performed on the disks, the functional device assigned at the first position being a mechanism for mounting a disk on a given spindle and the functional device assigned at the last position being a mechanism for dismounting the disk from a given spindle and ejecting it to the outside of the apparatus; and a turntable rotation controller which controls the turntable to rotate either in forward direction by an angle of $2n\pi/(n+m)$ or in reverse direction by an angle of $2m\pi/(n+m)$ such that the disk mounted by means of the disk mounting mechanism on the spindle corresponding thereto is positioned for the next functional device and that the spindle from which the disk has been dismounted by the last disk ejecting mechanism is positioned for the disk mounting mechanism, the sum of the angles through which the turntable rotates in forward direction being equal to the total angle of rotation in reverse direction, except that the turntable will not rotate fully once.

The second object of the invention can be attained by a method of inspection which comprises allowing the disk mounting mechanism to mount the disk on the spindle corresponding to said mechanism, and causing the turntable to rotate either in forward direction by an angle of $2n\pi/(n+m)$ or in reverse direction by an angle of $2m\pi/(n+m)$ such that at the point of time when each of the functional devices has ended its operation, the sum of the angles through which said turntable has rotated in forward direction is equal to the total angle of rotations in reverse direction, provided that said turntable has not rotated fully once, whereby the disks are positioned for the next functional device and the spindle from which the disk has been dismounted by said last disk ejecting mechanism is positioned for said disk mounting mechanism.

BRIEF DESCRIPTION OF THE DRAWINGS

FIGS. 4a–4f illustrate how the turntable rotates to complete one cycle of the necessary functional operations;

FIGS. 5a–5h are diagrams illustrating another embodiment of the invention in which seven functional devices are provided around a turntable;

FIGS. 6a–6h are diagrams illustrating yet another embodiment of the invention in which seven functional devices are provided around a turntable;

PREFERRED EMBODIMENTS OF THE INVENTION

Figure 1:
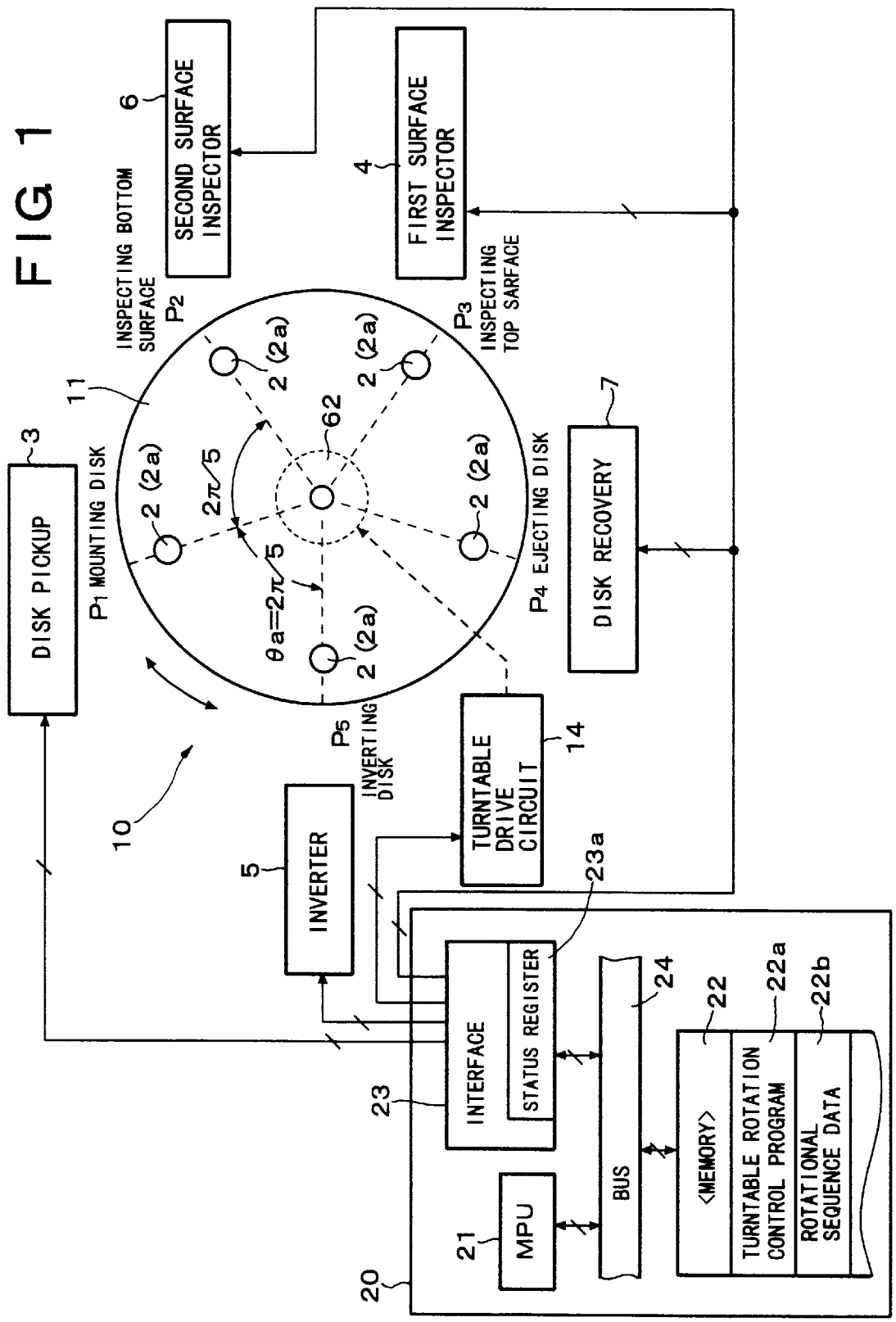
FIG. 1 is a diagram illustrating a disk inspecting apparatus according to an embodiment of the invention in which five functional devices are provided around a turntable.

Let us start the description of the invention by assuming that a turntable has k spindles arranged at equal angular spacings of $2\pi/k$ (k is 5 or a greater positive number) and that devices for performing the necessary functional operations on disks are provided around the turntable in positions corresponding to the respective spindles in the order of the of the functional operations to be performed. In order that a spindle on which the disk is mounted is transferred from one functional device to the next one, the turntable may be rotated by an angle of $2\pi/k$ or, alternatively, it may be rotated by integral multiples of $2\pi/k$ in either forward or reverse direction. If the turntable in the process of rotation in forward direction is allowed to rotate in reverse direction so that the disk is positioned in correspondence with the next functional device, the disk positioning can be accomplished without rotating the turntable fully once.

On the other hand, the functional devices have to be provided around the turntable sequentially at spacings of a specified angle. This is because each time the turntable rotates by a specified angle, the subsequent disk must simultaneously come to a position in correspondence with the functional device which is just upstream of the device of interest. If, under these conditions, the respective functional devices are provided around the turntable at equal angular spacings of $2\pi/k$, one may first rotate the turntable by a certain angle in forward direction, then reverse its direction and bring the disk to a position in correspondence with the next device by causing the turntable to rotate in reverse direction by an angle of $(2\pi-2\pi/k)$. In this case, the turntable will not rotate fully once but yet the total angle of rotations is close to 360 degrees.

In the present invention, the turntable is adapted to rotate in reverse direction by smaller angles. To this end, the respective functional devices are provided at spacings of $n\times 2\pi/k$ (n is an integer of 2 or more), or $2\pi n/k$, in the order of the functional operations to be performed by those devices. The turntable is rotated in forward direction by an angle of $2n\pi/k$ and, in the process of that rotation, the turntable is allowed to rotate in reverse direction by an angle of $2\pi-2\pi n/k$ so that the disk is positioned in correspondence with the next functional device. The angle of rotation in reverse direction that is required to have the disk (spindle) come into registry with the next functional device is $2\pi-2n\pi/k$ which is smaller than the heretofore required $2\pi-2\pi/k$.

Thus, in the present invention, the spindle is positioned in correspondence with the next functional device by first rotating the turntable in forward direction and then rotating it in reverse direction and yet the turntable need not be rotated fully once in order to perform all the necessary functional operations on the disk. What is more, the disk can be transferred from one functional device to the next one in the predetermined order even if the turntable is rotated in reverse direction and, as a result, the disks sequentially mounted on the spindles can be subjected to continued operations. This is because the position obtained by rotating the turntable in reverse direction by the angle $2\pi-2\pi n/k$ from the position of the present functional device is equal to the position of the functional device which is spaced from the present position by the angle $2\pi n/k$ in the forward direction of rotation. In other words, when the turntable is rotated by the angle $2\pi-2\pi n/k$ in reverse direction, the spindle on which the disk is mounted can be set in the position of the next functional device that is obtained by rotating the turntable in forward direction by the angle $2\pi n/k$. Therefore, as long as the respective functional devices are arranged in the order of their performing the required functional operations on the disks, the disks can be positioned in correspondence with the respective functional devices in the order of the functional operations to be performed.

Given the combination of the above-mentioned angles for rotations in forward and reverse directions, the disks mounted on the spindles are allowed to transfer from one functional device to another and although the turntable does not rotate fully once, the disks can be loaded, inspected and ejected in a continuous manner. The angle of oscillation (pivoting) of the turntable which is rotated in both forward and reverse directions is smaller than $2\pi-2\pi/k$. In addition, the angle through which the turntable is rotated to bring the disk to a position in correspondence with the next functional device is as large as $2\pi n/k$ or $2\pi-2\pi n/k$ and, therefore, the control in stopping the moving turntable can be accomplished with high positional precision even if it has an increased mass. On the other hand, if the angle of rotation is small, a heavy turntable cannot be brought to the correct stop position with high enough precision.

If the turntable is divided into k sectors (k=n+m), the angle of rotation in forward direction is $2n\pi/(n+m)$ and $2m\pi/(n+m)$ in reverse direction. Therefore, the individual functional devices are sequentially arranged around the turntable at spacings of the angle $2n\pi/(n+m)$ which is equal to the angle through which the turntable is rotated in forward direction.

The arrangement of the functional devices should be such that the position of the device to be assigned after the disk has circulated around the turntable does not coincide with the position of the device assigned previously. To meet this requirement, each of n and m should be a positive integer of 2 or more, n+m being 5 or more, and n being an odd number when m≠n and n+m is an even number. Details of these conditions for n and m will be given later in this specification.

When each disk has passed through all functional devices, the spindles on which the disks are mounted have to return to their initial positions. To meet this requirement, the sum of the angles through which the turntable has rotated in forward direction must be equal to the sum of the angles through which it has rotated in reverse direction. If this condition is satisfied, the turntable need not be rotated fully once to perform all functional operations without causing the wire connections to be twisted on account of its rotation in either forward or reverse direction and yet it can be returned to the initial position when all necessary operations have been completed.

As a result, the disks can be moved to pass through all functional devices by the oscillating (pivoting) action of the turntable which is rotated in both forward and reverse directions but without making a full rotation. In response to the successive rotations of the turntable, the disks to be inspected can be loaded, inspected and ejected in a continuous manner. Since the turntable makes an oscillating (pivoting) action consisting of rotations in forward and reverse directions, power supply lines and other wires required to drive the spindles can be directly connected to the spindles.

Figure 2:
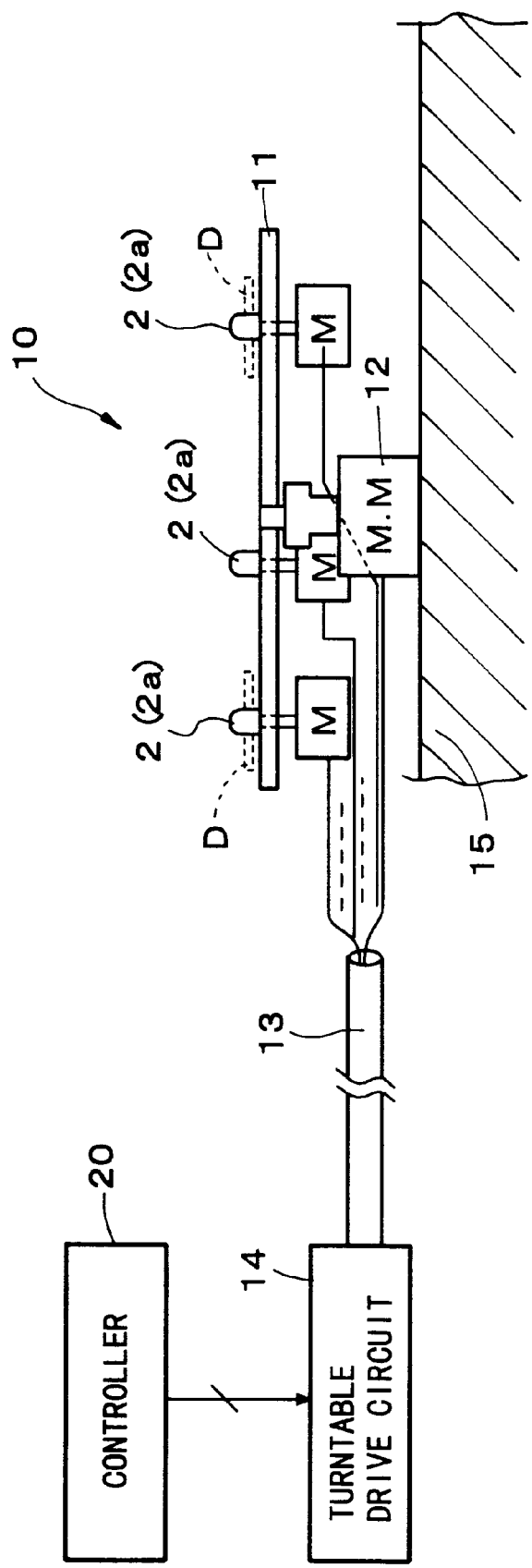
FIG. 2 is a side view of the turntable mechanism shown in FIG. 1.
Figure 3:
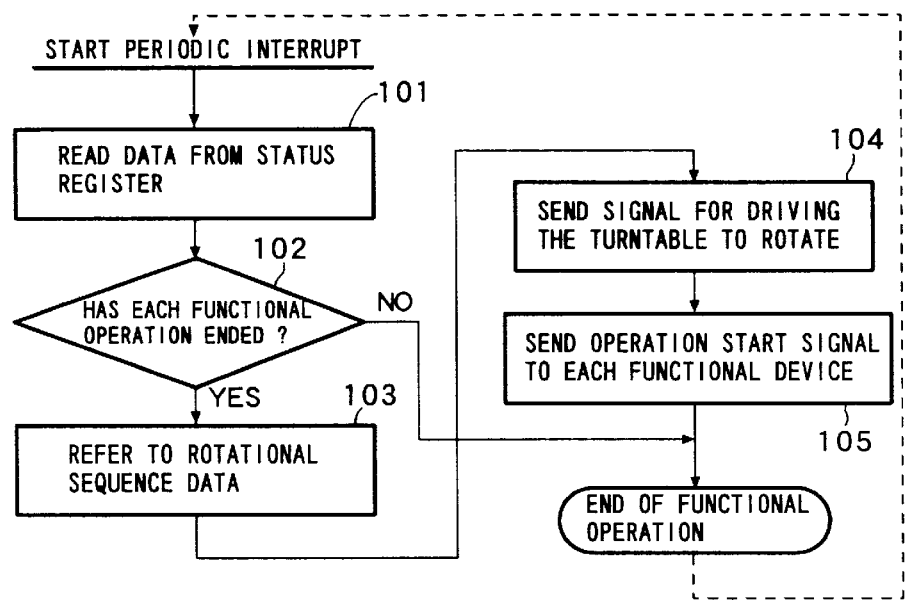
FIG. 3 is a flowchart for the process of controlling the rotation of the turntable.
Figure 7:
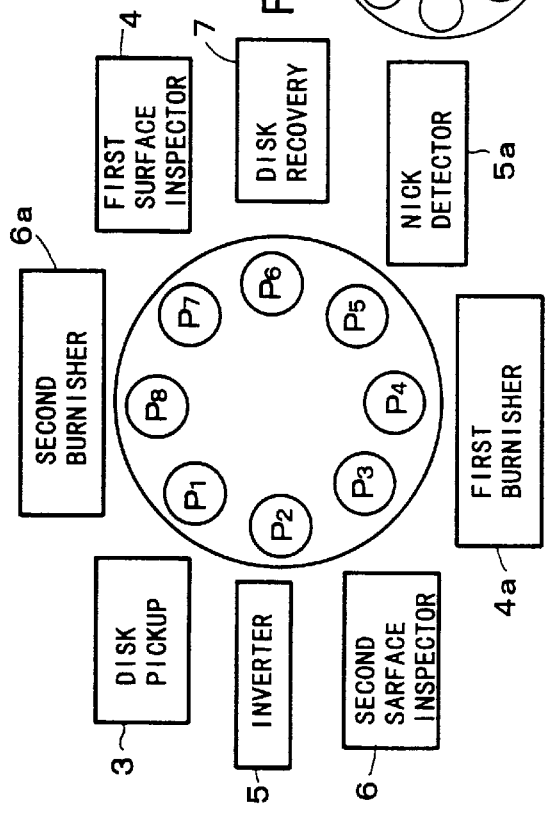
FIGS. 7a–7i are diagrams illustrating a further embodiment of the invention in which eight functional devices are provided around a turntable.

FIG. 1 is a diagram illustrating a disk inspecting apparatus according to an embodiment of the invention in which five functional devices are provided around a turntable; FIG. 2 is a side view of the turntable mechanism shown in FIG. 1; FIG. 3 is a flowchart for the process of controlling the rotation of the turntable; FIGS. 4a–4f illustrate how the turntable rotates to complete one cycle of the necessary functional operations; FIG. 5 is a diagram illustrating another embodiment of the invention in which seven functional devices are provided around the turntable; FIG. 6 is a diagram illustrating a modification of the embodiment shown in FIG. 5; and FIG. 7 is a diagram illustrating a further embodiment of the invention in which eight functional devices are provided around the turntable.

In FIG. 1, reference numeral 10 designates a turntable mechanism. As shown in FIG. 2, the turntable mechanism 10 comprises a main motor (M.M) 12 secured to a base frame 15, a turntable 11 to be rotated by the main motor 12, and five spindles 2 which are arranged on the turntable 11 at equal spacings of an angle $\theta$ (=$2\pi/5$=72°). The respective spindles are rotationally driven by motors M that are positioned beneath and which are supported by the turntable 11. The motors M and the main motor (M.M) 12 are driven as they are supplied with electric power through a wiring cable 13. The turntable 11 is equivalent to the turntable 1 shown in FIG. 8, except that the wire connection to each spindle is directly established by the cable 13 as shown in FIG. 2.

Figure 8:
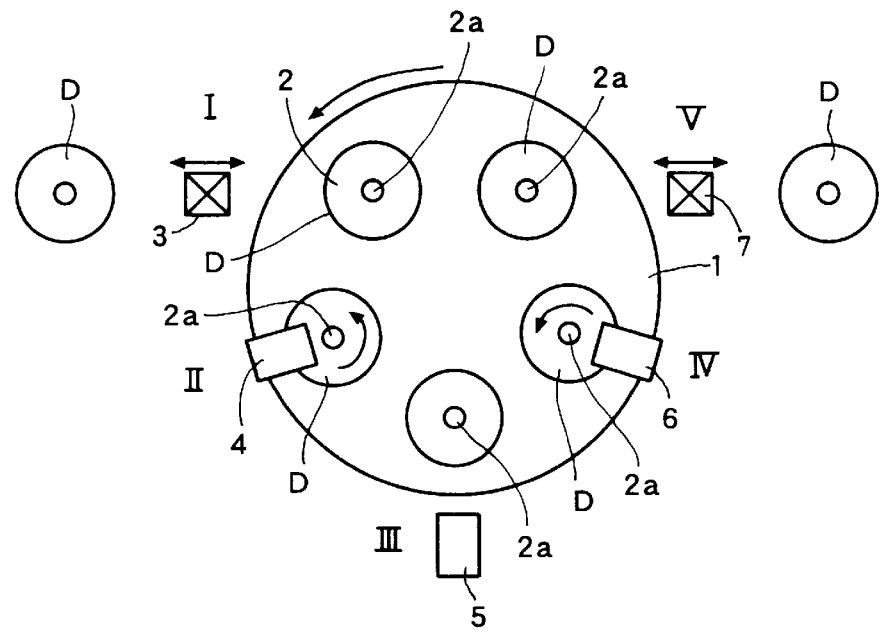
FIG. 8 is a diagram illustrating a prior art disk inspector.

In FIG. 1, the components which are the same as those shown in FIG. 8 are identified by like numerals and, hence, will not be described here in detail.

On the turntable 11, the five spindles 2 are sequentially provided at equal spacings of angle $\theta$ (=72°) and their positions may be designated P1–P5, respectively. The disk pickup 3 is set at position P1 in correspondence with the spindle. 2 in position Pl. With P1 taken as a reference position, the other functional devices are assigned clockwise (which is hereunder designated "in CW direction") at equal spacings of angle $2\theta$ (=144°) such that the first surface inspector 4 is positioned at P3, the inverter 5 at P5, the second surface inspector 6 at P2 and the disk recovery 7 at P4.

The arrangement of the individual functional devices differs from what is shown in FIG. 8 in that they are spaced apart by angle $2\theta$. In FIG. 1, the second surface inspector 6 is shown to be located upstream of the first surface inspector 4 in CW direction but, in fact, the second surface inspector 6 is downstream of the position attained by 360° rotation through successive assignments of the individual functional devices at equal spacings of $2\theta$. Therefore, the second surface inspector 6 follows the first surface inspector 4 in the right order. Similarly, the disk recovery 7 which is shown to be located upstream of the inverter 5 in fact follows the latter in the right order.

In order to ensure sequential inspection of the disks which are loaded on the turntable 11 continuously, the individual functional devices have to perform their functions in the predetermined order, i.e., the disk pickup 3 is followed by the first surface inspector 4, inverter 5, second surface inspector 6 and disk recovery 7 in that order. When one cycle of functional operations end, the disk pickup 3 comes into play.

The disk pickup 3 positioned at P1 mainly comprises a disk mounting mechanism having a handling robot, and the disk recovery 7 positioned at P4 mainly comprises a disk ejecting mechanism having another handling robot. The second surface inspector 6 positioned at P2 and the first surface inspector 4 positioned at P3 are each a device for optically checking either surface of the disk on the spindle 2 to see if it has any surface detects. Each inspector has inspection optics positioned in correspondence with the associated disks on the turntable 11 such that detection signals picked up with a CCD and other components in the inspection optics are fed into the respective inspectors. The inverter 5 positioned at P5 is a device for dismounting the disk from the spindle 2, turning it upside down and replacing the inverted disk on the same spindle 2; having this capability, the inverter 5 mainly comprises a disk inverting mechanism.

In the embodiment under consideration, the turntable is divided into five sectors and the respective functional devices (disk pickup 3, first surface inspector 4, inverter 5, second surface inspector 6 and disk recovery 7) are arranged in such a way that when the disk moving from one functional device to another by the angle $2\theta$ has completed two rotations (covered $4\pi$) on the turntable 11, it has passed through all functional devices (have been subjected to the necessary functional operations) to return to the initial position.

In this case (360 degrees or $2\pi$ is divided into 5 equal sectors), the disk can be brought to a position in correspondence with the next functional device by rotating the turntable either by angle $2\theta$ in forward direction or by angle $3\theta$ in reverse direction. In addition, in order to ensure that the spindle from which the disk has been dismounted by means of the disk recovery 7 will return to the correct position in correspondence with the disk pickup 3, the sum of the angles through which the turntable has rotated in forward direction is made equal to the total angle of rotations in reverse direction. This helps not only reduce the angle of oscillation (pivoting) of the turntable 11 but also enable the performance of all functional operations without requiring the turntable 11 to rotate fully once.

The structural design described above allows disks to be subjected to cyclic and continuous functional operations starting with the receipt of a disk on a spindle by the disk pickup 3 (in the initial position) and ending with returning the same spindle to the disk pickup 3. In the embodiment under discussion, three rotations in forward direction are combined with two rotations in reverse direction ($2\theta \times 3 - 3\theta \times 2 = 0$).

The turntable 11 is allowed to rotate in this way by means of a controller 20. The controller 20 controls the rotation of the turntable 11 via a turntable drive circuit 14. The controller 20 has a MPU (microprocessor) 21, a memory 22 and an interface 23, which are interconnected by a bus 24. The turntable drive circuit 14 and the individual functional devices are connected to the controller 20 via the interface 23. At the start of its operation, each functional device clears the associated flag in a built-in state register 23a in the interface 23 to "0" and at the end of the necessary functional operation, it sets the associated flag to "1".

The memory 22 stores a turntable rotation control program 22a which contains a rotational sequence data region 22b and the like.

The MPU 21 executes the turntable rotation control program 22a and periodically reads the content of the status register 23a in the interface 23 to determine whether all functional devices have completed the performance of their operations; if the answer is affirmative, the MPU 21 then causes the turntable 11 to rotate (in either forward or reverse direction).

Each functional device has a sensor to check if a disk is mounted on the spindle 2. Even if no disk is mounted on the spindle, each functional device sends a signal for "OPERATION COMPLETE" to the controller 20 in response to the signal detected by the sensor, whereupon the associated flag in the status register 23a is set to "1". The MPU 21 then concludes that the functional device associated with the disk-free spindle 2 has performed its operation.

The foregoing procedure taken by MPU 21 will now be described specifically with reference to FIG. 3. First, PERIODIC INTERRUPT is started to read data from the state register 23a (step 101) and MPU 21 determines whether each functional device has ended its operation (step 102). If the answer is negative, MPU 21 waits for the operation of interest to end such that the next INTERRUPT occurs.

Initially, only the disk pickup 3 is operational and the other functional devices are considered to have completed their operations since no disk is mounted on the associated spindles. Hence, at the point of time when the disk pickup 3 has ended its operation, the associated flag in the state register 23a is set to "1", whereupon all data in the state register 23a take the value "1". If this is the case, the next periodic INTERRUPT is started and the result of checking in step 102 becomes affirmative, in response to which the MPU 21 concludes that each functional device has ended its operation. In the next step, MPU 21 references the data in the rotational sequence data region 22b (step 103) and in accordance with this data, a drive signal for rotating the turntable 11 by a specified angle in a specified direction is sent to the turntable drive circuit 14 (step 104), whereupon the turntable 11 is rotated by the specified angle in the specified direction. In the next step, the MPU 21 outputs an operation start signal to each functional device (step 105) and when the necessary operation ends, the next INTERRUPT is started.

As a result of these steps, each functional device starts to perform the assigned operation on the disks. When the next INTERRUPT mode comes into play, steps 101–105 are repeated all over again. The time to the next INTERRUPT mode is sufficiently shorter than a tenth of the time required for completing the performance of necessary inspection procedures on one disk. In the usual case, detecting either surface of the disk takes a longer time than any other operations to be performed by the disk pickup, the inverter and the disk recovery.

The sequence of the rotation of the turntable in steps 103 and 104 is such that each time these steps are executed by MPU 21, the data in the rotational sequence data region 22b is referenced and rotation in either forward or reverse direction is repeated in the following order of 1–5, the data for which are stored in the region 22b:

1. rotation in CW (forward) direction by angle 2θ; 2. rotation in CW direction by angle 2θ; 3. rotation counterclockwise (CCW or in reverse direction) by angle 3θ; 4. rotation in CW direction by angle 2θ; 5. rotation in CCW direction by angle 3θ.

As the result of the control of the rotation of the turntable 11 by means of MPU 21 which is performed in step 104 in accordance with the rotational sequence data, the turntable 11 will be rotated in the manner shown in FIG. 4. Let us describe how the rotation of the turntable 11 is related to the functional operations to be performed on the disks. In the initial state, the MPU 21 causes the turntable 11 to rotate by means of the main motor (M.M) 12 via the turntable drive circuit 14 until a selected spindle 2 on which no disk is mounted stops at position PI. The handling robot in the disk pickup 3 takes a disk D-1 of interest out of a cassette and mounts it on the spindle 2 at position P1 (FIG. 4a). When each functional device has ends its operation, MPU 21 rotates the turntable 11 by angle 2θ in CW direction (FIG. 4b), whereupon the disk D-1 comes to position P3 as shown in FIG. 4b. At position P3, the inspection optics in the first surface inspector 4 is provided in correspondence with the disk D-1. As the spindle 2 is driven to rotate in a controlled manner via the controller 20, the first surface inspector 4 inspects the top surface of the disk D-1. In the meantime, the disk pickup 3 mounts a disk D-2 on the spindle which has come to position P1.

When each functional device has ended its operation, the MPU 21 then rotates the turntable 11 by angle 2θ in CW direction (FIG. 4c), whereupon the disk D-1 comes to position P5 as shown in FIG. 4c. At position P5, the inverter 5 turns the disk D-1 upside down. In the meantime, the disk pickup 3 mounts a disk D-3 on the spindle which has come to position P1, and the first surface inspector 4 inspects the top surface of the disk D-2 mounted on the spindle which has come to position P3.

When each functional device has ended its operation, the MPU 21 then rotates the turntable 11 by angle 3θ in CCW (reverse) direction, whereupon the disk D-1 comes to position P2 as shown in FIG. 4d. At position P2, the inspection optics in the second surface inspector 6 is provided in correspondence with the disk D-1. As the spindle 2 is driven to rotate in a controlled manner via the controller 20, the second surface inspector 6 inspects the bottom surface of the disk D-1. In the meantime, the disk pickup 3 mounts a disk D-4 on the spindle which has come to position P1. The first surface inspector 4 inspects the top surface of the disk D-3 mounted on the spindle which has come to position P3. In addition, the disk D-2 which has come to position P5 is turned upside down by means of the inverter 5.

When each functional device has ended its operation, the MPU 21 then rotates the turntable 11 by angle 2θ in CW direction, whereupon the disk D-1 comes to position P4 as shown in FIG. 4e. At position P4, the handling robot in the disk recovery 7 dismounts the disk D-1 from the spindle 2 and places it into a cassette which is to contain inspected disks. At the same time, the disk pickup 3 mounts a disk D-5 on the spindle which has come position P1. As for the spindle which has come to position P3, the first surface inspector 4 inspects the top surface of the disk D-4 mounted on that spindle. Further, the disk D-3 which has come to position P5 is turned upside down by means of the inverter 5. As for the disk D-2 which has come to position P2, its bottom surface is inspected by means of the second surface inspector 6.

When each functional device has ended its operation, the MPU 21 rotates the turntable 11 by angle 3θ in CCW direction, whereupon the spindle 2 from which the disk D-1 has been dismounted comes to position P1 as shown in FIG. 4f. The handling robot in the disk pickup 3 takes a disk D-6 of interest out of the cassette and mounts it on the spindle 2.

Thus, FIGS. 4a–4f show one cycle of operations that are performed on disks by means of the functional devices.

The above-described operations by the respective functional devices may be summarized as follows:

(a) Disk D-1 is mounted on a spindle;
(b) Turntable is rotated by angle 2θ in CW direction and the top surface of disk D-1 is inspected while at the same time disk D-2 is mounted on a spindle;
(c) Turntable is rotated by angle 2θ in CW direction and disk D-1 is turned upside down, the top surface of disk D-2 is inspected and disk D-3 is mounted on a spindle;

(d) Turntable is rotated by angle 3θ in CCW direction and the bottom surface of disk D-1 is inspected, disk D-2 is turned upside down, the top surface of disk D-3 is inspected and disk D-4 is mounted on a spindle;

(e) Turntable is rotated by angle 2θ in CW direction and disk D-1 is ejected, the bottom surface of disk D-2 is inspected, disk D-3 is turned upside down, the top surface of disk D-4 is inspected and disk D-5 is mounted on a spindle;

(f) Turntable is rotated by angle 3θ in CCW direction and disk D-2 is ejected, the bottom surface of disk D-3 is inspected, disk D-4 is turned upside down, the top surface of disk D-5 is inspected and disk D-6 is mounted on a spindle.

As will be apparent from FIG. 4f, when one cycle of functional operations have been performed, all of the five spindles have a disk mounted thereon and the individual functional devices will perform parallel operations on the disks mounted on the spindles corresponding to the respective devices. This contributes to an improvement in the efficiency of disk inspection.

FIG. 5 illustrates the case of controlling the rotation of the turntable 11 which is divided into seven sectors. The arrangement of the individual functional devices is shown in FIG. 5a. A first burnisher 4a for burnishing the top surface of a disk mounted on a spindle 2 is provided upstream of the first surface inspector 4 and a second burnisher 6a for burnishing the bottom surface of the disk is provided upstream of the second surface inspector 6. As a result, a total of seven functional devices are used in the case shown in FIG. 5 and they are arranged in the order of disk pickup 3 (at position P1), first burnisher 4a (P4), first surface inspector 4 (P7), inverter 5 (P3), second burnisher 6a (P6), second surface inspector 6 (P2) and disk recovery 7 (P5).

In the case under discussion, θ=2π/7 (=51.4°). Positions P1–P7 are taken by rotating the turntable in CW (forward) direction. The angle of each rotation in forward direction is 3θ and that in reverse direction of 4θ. As shown in FIG. 5a, the respective functional devices are arranged sequentially at equal spacings of angle 3θ in CW direction, with disk pickup 3 being located at position P1.

FIGS. 5b–5h show the way the turntable is controlled in rotation and the order of operations to be performed by the individual functional devices. In FIGS. 5b–5h, the order in which the first mounted disk circulates around the turntable to pass through the seven functional devices is indicated by encircled numerals.

The following sequence data are stored in the rotational sequence data region 22b which is to be referenced in step 103 shown in FIG. 3:

1. rotation in CW direction by angle 3θ; 2. rotation in CW direction by angle 3θ; 3. rotation in CCW direction by angle 4θ; 4. rotation in CW direction by angle 3θ; 5. rotation in CCW direction by angle 4θ; 6. rotation in CW direction by angle 3θ; 7. rotation in CCW direction by angle 4θ.

FIG. 6 also illustrates the case of controlling the rotation of the turntable 11 which is divided into seven sectors. The arrangement of the individual functional devices is shown in FIG. 6a. In the case shown in FIG. 6, the turntable is assumed to rotate in forward direction when it rotates counterclockwise (CCW) and the angle of each rotation in forward direction is 2θ whereas the turntable rotates in reverse direction (clockwise or CW) by angle of 5θ. As shown in FIG. 6a, positions P1–P7 are taken by rotating the turntable in CCW direction, with disk pickup 3 being located at position P1, and the respective functional devices are arranged sequentially at equal spacings of angle 2θ in CCW direction.

FIGS. 6b–6h show the way the turntable 11 is controlled in rotation and the order of operations to be performed by the individual functional devices. The encircled numerals have the same meaning as defined in connection with FIG. 5. The following sequence data are stored in the rotational sequence data region 22b which is to be referenced in step 103 shown in FIG. 3:

1. rotation by angle 2θ in CCW direction; 2. rotation by angle 2θ in CCW direction; 3. rotation by angle 2θ in CCW direction; 4. rotation by angle 5θ in CW direction; 5. rotation by angle 2θ in CCW direction; 6. rotation by angle 5θ in CW direction; 7. rotation by angle 2θ in CCW direction.

FIG. 7 illustrates the case of controlling the rotation of the turntable 11 which is divided into eight sectors. The arrangement of the individual functional devices is shown in FIG. 7a. In the case under discussion, a nick detector 5a which optically checks for the presence of nicks on the periphery of the disk mounted on a spindle 2 is provided upstream of the second burnisher 6a. As a result, a total of eight functional devices are used in the case shown in FIG. 7 and they are arranged in the order of disk pickup 3 (at position P1), first burnisher 4a (P4), first surface inspector 4 (P7), inverter 5 (P2), nick detector 5a (P5), second burnisher 6a (P8), second surface inspector 6 (P3) and disk recovery 7 (P6).

In the case under discussion, θ=2π/8 (=45°). The turntable is assumed to rotate in forward direction when it rotates counterclockwise (CCW) and the angle of each rotation in forward direction is 3θ whereas the turntable rotates in reverse direction (clockwise or CW) by angle of 5θ. As shown in FIG. 7a, the respective functional devices are arranged sequentially at equal spacings of angle 3θ in CCW direction, with disk pickup 3 being located at position P1.

FIGS. 7b–7i show the way the turntable 11 is controlled in rotation and the order of operations to be performed by the individual functional devices. The encircled numerals have the same meaning as defined in connection with FIG. 5. The following sequence data are stored in the rotational sequence data region 22b which is to be referenced in step 103 shown in FIG. 3:

1. rotation by angle 3θ in CCW direction; 2. rotation by angle 3θ in CCW direction; 3. rotation by angle 5θ in CW direction; 4. rotation by angle 3θ in CCW direction; 5. rotation by angle 5θ in CW direction; 6. rotation by angle 3θ in CCW direction; 7. rotation by angle 3θ in CCW direction; 8. rotation by angle 5θ in CW direction.

In each of the embodiments shown in FIGS. 1, 5, 6 and 7, the direction of the rotation of the turntable 11 may be reversed in any position as long as it is in the process of rotation in forward direction. This is because the rotation in reverse direction is equivalent to the rotation in forward direction in that both are capable of bringing a disk to a position in correspondence with the next functional device. What is important to the purposes of the present invention is that the sum of angles through which the turntable is rotated in forward direction be equal to the total angle of rotation in reverse direction and that the turntable be allowed to rotate in reverse direction in such a position that the angle of oscillation (pivoting) of the turntable 11 is made adequately small. If these conditions are met, disks can be subjected to all necessary functional operations without causing the turntable to rotate fully once or twisting the wire connections to it and yet the turntable can be returned to the initial position.

We will now describe the general relationship between the conditions for arranging the respective functional devices and the way to control the rotation of the turntable. For the sake of convenience in explanation, let us write the angle of each rotation in forward direction as $2n\pi/(n+m)$ and the angle of each rotation in reverse direction as $2m\pi/(n+m)$. Also assume that the turntable 11 is divided into k (=n+m) sectors, with the individual functional devices being arranged in the order of operations to be performed on disks. In this case, the turntable 11 is divided at equal spacings of angle $2\pi/(n+m)$. Needless to say, spindles 2 are accordingly positioned at equal spacings of the same angle. In order to inspect the disks continuously, at least five functional devices are required and, hence, k (=n+m) is 5 or more.

If the respective functional devices are assigned sequentially along the circumference of the turntable 11 at an angle of $2\times 2\pi/(n+m)$ or more and if the angle of assignment is expressed by $2\pi n/(n+m)$, n and m are each an integer of 2 or more. If k (=n+m) is an odd number, the functional device that is assigned after a disk of interest has circulated around the turntable 11 will not overlap the previously assigned device and the respective functional devices can be assigned to the positions determined by dividing the turntable into k sectors.

In the case where k is an even number, assignment of the functional devices is impossible if n=m. Therefore, the case of n=m is excluded. If k is an odd number, n is in no case equal to m. In the case where k is an even number and n≠m and if n is an even number, the functional devices assigned after the disks have circulated around the turntable 11 will overlap the previously assigned devices. To avoid this situation, n must be an odd number.

In the embodiments shown in FIGS. 1, 5, 6 and 7, all of the functional devices assigned in the manner described above perform specified operations on disks but this is not the sole case of the invention and a "dummy" device which makes no effective operation on disks may be provided. The disk pickup (disk mounting mechanism) may include a disk recovery (disk ejecting mechanism) using a common handling robot. In addition to those employed in the foregoing embodiments, other functional devices may be used such as a disk cleaner, a disk dryer, an electromagnetic characteristics certifier, an optical certifier, a glide tester and an optical glide tester.

A prior art disk inspecting apparatus which is an integral assembly of a glide tester, a burnisher and a certifier is shown in U.S. Pat. No. 5,423,111. A prior art surface inspector is shown in U.S. Pat. No. 5,245,403. A combination of a surface inspector and a nick detector is shown in Unexamined Published Japanese Patent Application No. Hei 7-190951. These prior patents are also incorporated herein by reference.

As described on the foregoing pages, the disk inspecting apparatus of the invention has the following characteristics: the functional devices which will perform various operations for inspecting disks are arranged around the turntable at equal spacings of angle $2n\pi/(n+m)$; the turntable is rotated in forward direction by an angle of $2n\pi/(n+m)$ and in reverse direction by an angle of $2m\pi/(n+m)$; and the sum of angles through which the turntable is rotated in forward direction is equal to the total angle of rotations in reverse direction.

As a result, the disks to be inspected can pass through all the necessary functional devices in a specified order without requiring the turntable to rotate fully once but by oscillating (pivoting) it through rotations in forward and reverse directions. Thus, as the turntable rotates, the disks can be loaded on spindles, inspected and ejected in a continuous manner. Since the turntable does not rotate fully once but oscillates in both forward and reverse directions, power supply lines and various other wires necessary to drive the spindles can be directly connected to them.

What is claimed is:

1. A disk inspecting apparatus comprising a circular turntable, a plurality of spindles for mounting disks to be inspected which are arranged on the turntable at equal spacings of a specified angle, and functional devices which are provided around said turntable in respective correspondence with said spindles such that they will perform specified operations on said disks mounted on said spindles, said turntable being rotated as said functional devices sequentially perform the specified operations on said disks to thereby inspect the disks continuously, wherein:

said spindles are n+m in number and provided in correspondence with angular positions that are determined by dividing said turntable into equal portions at an angle of $2\pi/(n+m)$ (where n and m are each an integer of 2 or more; n+m is 5 or more; when n≠m and n+m is an even number, n is an odd number);

said functional devices are at least five in number and sequentially assigned in correspondence with said spindles as they are provided around said turntable at equal spacings of the angle $2n\pi/(n+m)$ in a given direction and in the order of functional operations which are to be performed on said disks, the functional device assigned at the first position being a mechanism for mounting said disk on a given spindle and the functional device assigned at the last position being a mechanism for dismounting said disk from a given spindle and ejecting it to the outside of the apparatus; and said apparatus further including a turntable rotation controller which controls said turntable to rotate either in forward direction by an angle of $2n\pi/(n+m)$ or in reverse direction by an angle of $2m\pi/(n+m)$ such that the disks mounted on said spindles by means of said disk mounting mechanism are positioned for the next functional device and that the spindle from which the disk has been dismounted by said last disk ejecting mechanism is positioned for said disk mounting mechanism, the sum of angles through which said turntable rotates in forward direction being equal to the total angle of rotations in reverse direction, except that said turntable will not rotate fully once.

2. The disk inspecting apparatus according to claim 1, wherein a first surface inspector which checks for the presence of any defects on the top surface of said disk mounted on a given spindle, a disk inverting mechanism with which said disk mounted on a given spindle is dismounted, turned upside down and remounted on the same spindle and a second surface inspector which checks for the presence of any defects on the bottom surface of said disk mounted on a given spindle are provided as functional devices between said disk mounting mechanism and said disk ejecting mechanism and wherein said disk inverting mechanism corresponds to the position of the spindle which is downstream of said first surface inspector in the circulation in said given direction, said second surface inspector corresponds to the position of the spindle which is downstream of said disk inverting mechanism in the circulation in said given direction, and said rotation in either forward or reverse direction is performed by means of said turntable rotation controller after said functional devices have completed all of their operations.

3. The disk inspecting apparatus according to claim 2, wherein said first surface inspector, said disk inverting mechanism and said second surface inspector are provided in that order between said disk mounting mechanism and said disk ejecting mechanism as functional devices in correspondence with the positions of the associated spindles in the circulation in said given direction and wherein after the rotation of said turntable either in said forward direction or in said reverse direction, said disk mounting mechanism mounts the disk on the spindle corresponding to said mechanism and said disk ejecting mechanism ejects the disk to the outside of said apparatus.

4. The disk inspecting apparatus according to claim 3, wherein n is 2 and m is 3.

5. The disk inspecting apparatus according to claim 2, wherein a first burnisher for burnishing the top surface of said disk mounted on a given spindle, said first surface inspector, said disk inverting mechanism, a second burnisher for burnishing the bottom surface of the disk mounted on a given spindle, and said second surface inspector are provided in that order between said disk mounting mechanism and said disk ejecting mechanism as functional devices in correspondence with the positions of the associated spindles in the circulation in said given direction.

6. The disk inspecting apparatus according to claim 5, wherein n is 3 and m is 4.

7. The disk inspecting apparatus according to claim 5, wherein n is 2 and m is 5.

8. The disk inspecting apparatus according to claim 2, wherein a first burnisher for burnishing the top surface of said disk mounted on a given spindle, said first surface inspector, said disk inverting mechanism, a nick detector which checks for the presence of nicks on said disk mounted on a given spindle, a second burnisher for burnishing the bottom surface of said disk mounted on a given spindle and said second surface inspector are provided in that order between said disk mounting mechanism and said disk ejecting mechanism as functional devices in correspondence with the positions of the associated spindles in the circulation in said given direction.

9. The disk inspecting apparatus according to claim 8, wherein n is 3 and m is 5.

10. The disk inspecting apparatus according to claim 1, wherein said disk mounting mechanism includes said disk ejecting mechanism.

11. A method of inspecting disks using an apparatus comprising a circular turntable, a plurality of spindles for mounting disks to be inspected which are arranged on the turntable at equal spacings of a specified angle, and functional devices which are provided around said turntable in respective correspondence with said spindles such that they will perform specified operations on said disks mounted on said spindles, said turntable being rotated as said functional devices sequentially perform the specified operations on said disks to thereby inspect the disks continuously, wherein:

said spindles are n+m in number and provided in correspondence with angular positions that are determined by dividing said turntable into equal portions at an angle of $2\pi/(n+m)$ (where n and m are each an integer of 2 or more; n+m is 5 or more; when n≠m and n+m is an even number, n is an odd number) and wherein said functional devices are sequentially assigned in correspondence with said spindles as they are provided around said turntable at equal spacings of the angle $2n\pi/(n+m)$ in a given direction and in the order of functional operations which are to be performed on said disk, the functional device assigned at the first position being a mechanism for mounting said disk on a given spindle and the functional device assigned at the last position being a mechanism for dismounting said disk from a given spindle and ejecting it to the outside of the apparatus, and at least three functional devices being assigned between said first position and said last position; said method comprising:

allowing said disk mounting mechanism to mount said disk on the spindle corresponding to said mechanism;

causing said turntable to rotate either in forward direction by an angle of $2n\pi/(n+m)$ or in reverse direction by an angle of $2m\pi/(n+m)$ such that at the point of time when each of said functional devices has ended its operation, the sum of angles through which said turntable has rotated in forward direction is equal to the total angle of rotations in reverse direction, provided that said turntable has not rotated fully once, whereby said disks are positioned for the next functional device and the spindle from which the disk has been dismounted by said last disk ejecting mechanism is positioned for said disk mounting mechanism; and dismounting said disk from said spindle and ejecting it to the outside of the apparatus by means of said disk ejecting mechanism.

12. The method according to claim 11, wherein said disk mounting mechanism continuously mounts said disk on the spindle corresponding to said mechanism according as said turntable rotates and said disk ejecting mechanism ejects said disk to the outside of the apparatus continuously according as said turntable rotates.

13. The method according to claim 11, wherein a first surface inspector which checks for the presence of any defects on the top surface of said disk mounted on a given spindle, a disk inverting mechanism with which said disk mounted on a given spindle is dismounted, turned upside down and remounted on the same spindle and a second surface inspector which checks of the presence of any defects on the bottom surface of said disk mounted on a given spindle are assigned as the functional devices provided between said disk mounting mechanism and said disk ejecting mechanism, and wherein said disk inverting mechanism corresponds to the position of the spindle which is downstream of said first surface inspector in the circulation in said given direction and said second surface inspector corresponds to the position of the spindle which is downstream of said disk inverting mechanism in the circulation in said given direction.

14. The method according to claim 11, wherein said disk mounting mechanism includes said disk ejecting mechanism.

* * * * *